United States Patent [19]

Hinrichs

[11] 4,005,317
[45] Jan. 25, 1977

[54] SWITCHING CIRCUITRY
[75] Inventor: Karl Hinrichs, Downey, Calif.
[73] Assignee: Dressen-Barnes Electronics Corporation, Pasadena, Calif.
[22] Filed: May 27, 1975
[21] Appl. No.: 580,587
[52] U.S. Cl. .............................. 307/253; 307/246; 307/273; 307/300
[51] Int. Cl.² .................. H03K 17/60; H03K 17/04
[58] Field of Search .......... 307/300, 253, 246, 273, 307/275

[56] References Cited
UNITED STATES PATENTS

| 3,571,624 | 3/1971 | Leung | 307/300 X |
| 3,610,963 | 10/1971 | Higgins | 307/253 X |
| 3,757,144 | 9/1973 | Hendrikus et al. | 307/300 |
| 3,840,755 | 10/1974 | Benner et al. | 307/300 X |

Primary Examiner—John Zazworsky
Attorney, Agent, or Firm—Francis X. LoJacono, Sr.

[57] ABSTRACT

The present invention relates to switching circuitry wherein a low-loss "drive" inductance is "charged" and "discharged" to provide the energy for turning a power switch on and off. The drive-inductance and a tapped-winding transformer co-act in a novel manner to provide a large "sweep-out" current that quickly turns off the power switch, the sweep-out time being extremely short.

7 Claims, 7 Drawing Figures

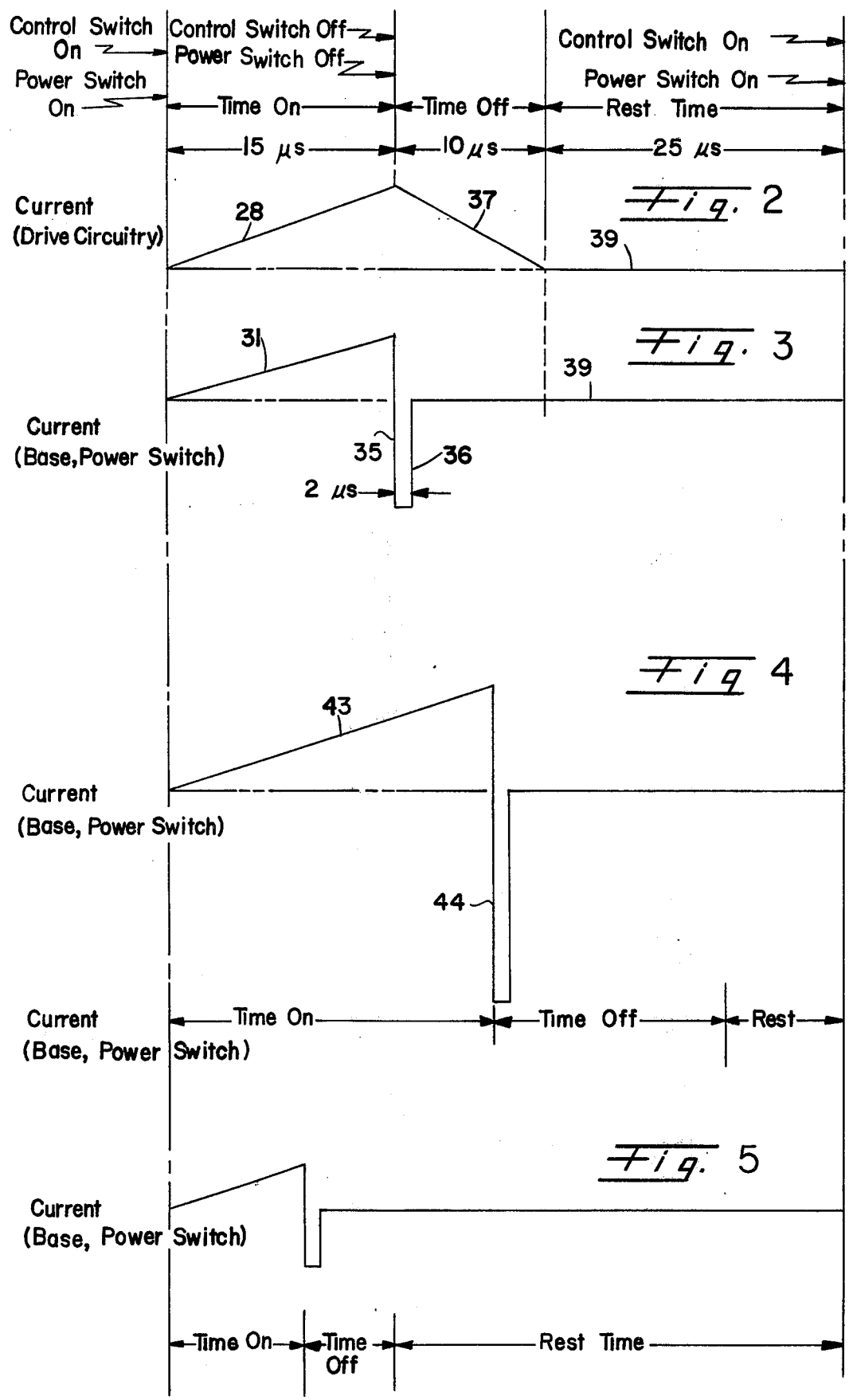

SWITCHING CIRCUITRY

BACKGROUND

In the field of electronics, it is frequently necessary to "transform" one form of electricity to another form, such transformations taking place in circuits known as power sources, converters, inverters, rectifiers, etc. Some of these circuits function, for example, to transform AC to DC, DC to AC, DC of one voltage to DC of another voltage, etc. Such circuits often use switches of one type or another; but, unfortunately, switches tend to raise severe problems — such as power loss, low efficiency, undesirable heating, transients, impaired lifetimes, and the like.

OBJECTIVES AND DRAWINGS

It is, therefore, the principal objective of the present invention to provide improved switching circuitry.

It is another objective of the present invention to provide improved switching circuitry that provides extremely fast turn-off.

It is still another objective of the present invention to provide improved switching circuitry wherein a low-power system controls a high-power system.

It is a further objective of the present invention to provide improved switching circuitry adapted to be used in a cascaded manner, in order to control the switching of even higher power systems.

It is a further objective of the present invention to provide improved switching circuitry adapted to be used in a timed manner, in order to provide higher-power and smoother-power systems.

The attainment of these objectives and others will be realized from a study of the following description taken in conjunction with the drawings, of which:

FIG. 2 shows the electric current in the drive-circuit portion of the invention:

FIG. 3 shows the electric current in the base portion of the power transistor, during a normal-load condition;

FIG. 4 shows the electric current in the base portion of the power transistor, during a high-load condition;

FIG. 5 shows the electric current in the base portion of the power transistor, during a low-load condition;

SYNOPSIS

Figure 1:
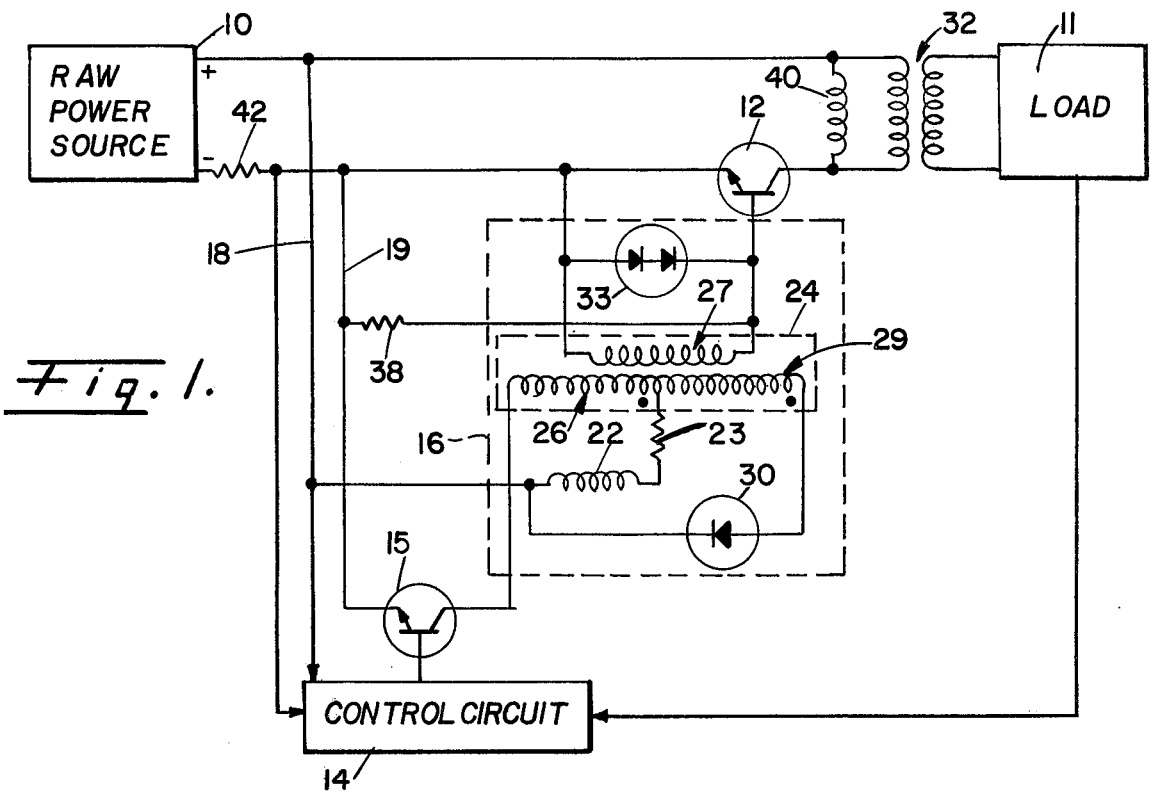
FIG. 1 shows a schematic diagram of the disclosed invention.

The present inventive concept discloses an electronic switching circuitry wherein a charging current charges a drive inductance, and simultaneously turns on a power transistor — utilizing a given primary winding and the secondary winding of a drive transformer. The energy stored in the drive inductance is then used with a second primary winding and the same secondary winding, in order to turn off the power transistor — the turns ratio of the windings producing a large sweep-out current that quickly de-saturates the conductive power transistor. A protective blocking-diode arrangement protects the circuit and controls the discharge of the drive inductance. The circuit automatically adjusts to varying loads and to other conditions.

INTRODUCTION

It was pointed out above that switches (regardless of whether they ar mechanical or electrical) are often a source of difficulty; and one such difficulty may be understood from the following discussion. First of all, it should be recalled that power may be described by the mathematical expression "V I" — where "I" is the electric current through an element, and "V" is the voltage across that element.

When a switch is actually "closed" (ON) to complete an electric circuit, the electric current "I" flowing through it may be quite large; but the electric voltage "V" across the switch is very small (practically zero). Therefore, the power represented by the expression "V I" is very small. Thus, when a switch is in a closed or ON state, the switch does not release any appreciable power — or heat loss.

When a switch is actually "open" (OFF) to break an electric circuit, the voltage "V" may be very large; but the electric current "I" flowing through the switch is relatively small (practically zero). Therefore, the power represented by the expression "V I" is again very small. Thus, when a switch is in its open or OFF state, the switch does not release any appreciable power or heat.

However, during its transient state, the switch is partially open/ partially closed. Therefore, the electric current "I" and the electric voltage "V" are both appreciable; and both are varying — so that the power represented by the expression "V I" is also appreciable and varying. This can lead to overheating of the switch and its environment, shortened life for the switch, loss of power and thus low efficiency, transient currents and voltages, etc.

It has long been recognized that, in order to minimize this particular switch problem, a switch should open and close very rapidly and very positively; and the trend has been from the relatively slow mechanical switches toward the relatively fast electronic switches. The electronic switches, in turn, trend toward the use of faster electronic switching circuitry — which, unfortunately, tends to become relatively complex. While these electronic switching circuits usually achieve their goal of fast switching, the resultant circuitry has often required extra power, so that the overall improvement is achieved at the expense of heating and inefficiency.

Most of the prior-art switching circuitry required complex interconnections, amplifiers, and a plurality of transistors, in order to provide rapid and positive switching; but the present invention achieves this result in a very simple two-transistor manner.

The present inventive concept will be better understood from FIG. 1. Here, power from a power source 10 (such as one that provides a DC voltage) is to be applied to a load 11, using a "power" switch 12 that — in the exemplified case — may typically be a transistor such as a 2N2222A, 2N3019, 2N5664, DTS814, or the like.

THE CONTROL CIRCUIT

The power switch 12 is opened and closed as follows. FIG. 1 indicates a control circuit 14 that preferably takes the form of an electronic oscillator, operating — typically — in the range of 20K–50K Hertz (cycles per second). Suitable control signals are applied from the control circuit 14 to a control switch 15, in order to conductivate or to de-conductivate the switch 15. Control switch 15 is in a low-power system and does not handle any appreciable amount of power; so that a commerically-available transistor such as 2N2222A, 2N3019, DTS814, etc., may be used.

Thus, the control transistor 15 becomes conductive and non-conductive, in accordance with signals from the control circuit 14 — in this way, functioning as a closed or as an open control switch 15 for a drive circuit 16 that will be described later.

THE DRIVE CIRCUITRY (CHARGE CIRCUIT)

FIG. 1 shows the drive circuit 16 to comprise two circuits — one of which is a "charge" circuit and the other of which is a "discharge" circuit, both of which will be discussed later.

In FIG. 1, the above-mentioned charge circuit is illustrated as comprising a "drive" inductance 22, a current-limiting drive resistance 23, and a drive transformer 24 having a "charge" primary winding 26 and a secondary winding 27. Electric connections 18 and 19 are used to form a series charge circuit that includes the power source 10, the charge circuit, and the control switch 15.

CHARGE CIRCUIT OPERATION
(POWER-SWITCH CLOSING)

Assume that at a given instant, the control circuit 14 provides a control signal that causes the control transistor 15 to become conductive. Electric current thereupon flows from power source 10 through the charge circuit (drive inductance 22, resistance 23, and the charge primary winding 26) and through the control transistor 15 — to thus "charge" the drive inductance 22 by creating a magnetic field associated therewith. Due, primarily, to the characteristics of the drive inductance 22 and the power source 10, the charge current flowing through the drive inductance increases linearly in the manner indicated at the charge current upramp 28 of FIG. 2.

As the charge current flows through the charge primary winding 26 of FIG. 1, transformer action generates a "charge" voltage in the secondary winding 27 of the drive transformer 24, the magnitude of this charge secondary voltage being a function of the turns ratio (typically 4:1) of the charge primary winding 26 to the secondary winding 27.

This charge voltage is applied to the base electrode of the power transistor 12, which becomes conductive when this charge secondary voltage exceeds the voltage drop (Veb) of the emitter-base circuit of the power transistor 12, producing the upramp 31 of FIG. 3. The power transistor 12 becomes conductive in two senses: (A) load current flows through its emitter-collector circuit from power source 10 to load 11, and (B) base-drive current flows through its emitter-base circuit and through the secondary winding 27 of the transformer 24. The increasing base-drive current of the power transistor 12 is indicated at base-drive upramp 31 of FIG. 3, and assures that the power transistor 12 quickly becomes and remains conductive, and is placed in a saturated condition to obtain low voltage drop and power loss. Thus, the charge secondary voltage and the resultant base-drive current act as an "enabling" signal that turns on or closes the power transistor 12.

Transistor design is such that the transistor has a high sensitivity in its quiescent state; that is, the transistor is on the verge of becoming conductive in response to a small enabling signal. Therefore, the power transistor 12 becomes conductive practically immediately — to permit the flow of load current from power source 10, through the now-conductive power transistor 12, to the load 11. If so desired, the current may flow to the load 11 through a load transformer 32 of FIG. 1.

THE DRIVE CIRCUITRY (DISCHARGE CIRCUIT)

Referring again to FIG. 1, the above-mentioned discharge circuit comprises the drive inductance 22, the resistance 23, the discharge primary winding 29, the blocking diode 30, and the secondary winding 27 of the drive transformer 24 — which may, therefore, be of the tapped-primary type. The secondary winding 27, as indicated above, is connected to the power transistor 12; and a suitable blocking diode arrangement 33 (to be discussed more fully later) is connected across the secondary winding 27.

DISCHARGE CIRCUIT OPERATION
(POWER-SWITCH OPENING)

As indicated above, transistor design establishes the quiescent state of the transistor to be one at which a small enabling signal would make the transistor conductive. However, once the transistor becomes conductive, it contains a surplus of "carriers" which must be removed — i.e., they must be "swept out" before the transistor can again become non-conductive. This carrier surplus, particularly large for a transistor operating in the low-loss "saturated" or "excess base current" region, causes one of the switch problems referred to earlier — the switch cannot be opened, or made non-conductive, until all of these stored carriers are removed via the base lead.

Prior-art circuits achieved sweep-out by the use of base-emitter clamps, by the use of reverse-charged capacitors switched onto the base, by the use of switched batteries, etc. While these approaches work quite well for fixed conditions and negative supplies, they are generally not appropriate for a dynamic range of transistor operations that includes states of high and low loads, etc.; and, furthermore, these prior-art circuits usually required complex timing and switch-drive arrangments.

The disclosed circuit solves this problem as follows. Power switch 12 is opened when a suitable de-energizing control signal from control circuit 14 causes the control transistor 15 to become non-conductive, and to break the previously described charged circuit. As a result of breaking the charged circuit, the erstwhile charge current can no longer flow through the charge circuit. However, due to the inherent characteristic of drive inductance 22, the now-charged drive inductance causes the erstwhile charge current to continue to flow in the same direction through the drive inductance 22. The erstwhile charge electric current, therefore, flows through resistance 23, through the discharge primary winding 29, and through the erstwhile blocking diode 30. Blocking diode 30, because of its polarity, had previously blocked the charge current from flowing through the discharge circuit; but, because of its polarity, it now permits the discharge current to flow through the discharge circuit, as described above. The amplitude of the discharge current in the drive circuit decreases linearly, as indicated at the downramp 37 of FIG. 2.

The effect of discharge current flow in the discharge circuit is as follows. Since the discharge current is flowing through the discharge primary winding 29 in a direction that is opposite to the former direction of flow of the charge current through the primary charge winding 26, it now tends to induce an opposite-polarity secondary (discharge) voltage in secondary winding 27. The magnitude of this secondary discharge voltage is that required to establish a secondary current equal and opposite to the turns ratio (typically 8:1) times the primary current. This reversed-polarity secondary discharge voltage is applied to the base electrode of power transistor 12, where it acts as a disabling signal (to be more fully discussed later) that turns off the power transistor 12, and thus terminates the flow of load current from the power source 10 to the load 11.

The disabling signal applied to the power transistor 12 has an unusual characteristic that may be understood from the following discussion. It will be noted that the primary discharge winding 29 and the secondary winding 27 are part of the same drive transformer 24; and, therefore, with the exception of the small exciting current, the ampere-turns (IsNs) of the secondary winding 27 must be equal to the ampere-turns (IpNp) of the primary discharge winding 29. Therefore, because of the 1:8 turns ratio, the secondary discharge winding 27 must have an electric current that is eight times as large as the discharge current in the primary discharge winding — which happens to be at its peak value at the instant under discussion. As a result, the instantaneous disabling current is quite large, and flows in a "negative" direction — as indicated at 35 of FIG. 3, the flow path being through the secondary circuit of FIG. 1 (being comprised of the secondary winding 27 and the still-conductive emitter/base circuit of the power transistor 12).

The large disabling current, which comprises the surplus carriers, "sweeps out" the surplus carriers from the base electrode, and has the following effects. As soon as the surplus carriers are swept out by the large sweep-out current, their absence and the reverse-bias of the base-emitter junction (preventing more carrier injection) breaks the emitter/base circuit of power transistor 12. Therefore, the negative direction sweep-out current is terminated, as indicated at 36 of FIG. 3; and its value goes to zero. The sweep-out interval is quite short, typically being about two microseconds.

Simultaneously, the removal of base carriers by the sweep-out current breaks the emitter/collector circuit of the power transformer, and thus terminates the load current, so that a rapid opening of the power transistor 12 is achieved in a simple manner. The power switch 12 is thus turned off, or opened, by a sweep-out current — rather than by a voltage, the power switch being turned on and off automatically, quickly, and positively, at the optional times for the operation of the circuitry.

It should be noted that the source for the sweep-out current is the drive inductance 22, assisted by the smaller exciting current of the drive transformer 24, acting through the discharge circuit and the secondary-winding circuit.

It was indicated above that the charge drive inductance 22 is the energy source for the sweep-out current; but it is important that the energy stored in the drive inductance be sufficient for varying operational conditions. As a result, there may be times when some energy is still stored in the drive inductance at the end of the sweep-out operation. This situation is handled as follows.

It will be noted from FIG. 1 that the blocking-diode arrangement 33 is connected across the secondary winding 27, the polarity of the blocking-diode arrangement 33 being such that it is not conductive during the enabling portion of the operation, but is adapted to become conductive — under proper conditions — during the disabling portion of the operation.

The proper condition for conductivity of the blocking-diode arrangement 33 does not exist during the sweep-out current flow discussed above, because during that time the emitter/base circuit of the power transistor 12 is conductive — and produces a low-voltage path that prevents the blocking-diode arrangement 33 from becoming conductive. However, as soon as the sweep-out operation is completed, the emitter/base circuit of the power transistor 12 becomes non-conductive; and, under this condition, the secondary winding 27 might produce an excessively high back-bias voltage across the emitter/base portion of the transistor 12.

In order to prevent the occurrence of such an excessively high voltage that might burn out the power transistor 12, the building-up of this voltage produces the condition under which the blocking-diode arrangement 33 becomes conductive, and thus completes a secondary parallel circuit by serving as a voltage clamp and as a load for the secondary winding 27. In this way, the charged drive inductance 22 is drained of its surplus stored energy, as indicated by down ramp 37 of FIG. 2.

It should be noted that the two-diode, blocking-diode arrangement 33 of FIG. 1 produces the downramp 37 of FIG. 2, thus helping to control the discharge rate of the drive inductance 22. A three-diode, blocking arrangement 33 would produce a steeper slope for downramp 37; and a one-diode, blocking arrangement 33 would produce a flatter downramp 37.

Once the power transistor 12 is turned off, as explained above, it is held in its non-conductive state by the base-drain resistance 38, awaiting the next cycle, as indicated at 39 in FIGS. 2 and 3.

In this way, a repetitively driven power switch may transfer power measred at hundreds or thousands of watts — and at high-current levels, being controlled by a low-power control switch. Moreover, only minimal amounts of heat are produced.

In summary, the circuitry operates as follows. During the ON portion of the cycle, the drive inductance 22 is being charged, and the drive current flows in a given direction through the charge primary winding 26 which functions to provide a base-driven current that turns on the power transistor 12. During the OFF portion, the drive inductance 22 is being discharged; and the discharge current flows in the opposite direction through the discharge primary winding 29, which functions to produce a sweep-out current that turns off the power transistor 12. Thus, the drive transformer 24 has a push/pull action that alternately enables and disables the power transistor 12.

As may be understood from the above explanation, power is transmitted from the power source 10 to a load 11, the disclosed circuitry functioning to deliver a train of timed power pulses having a roughly saw-tooth waveform. If the power source 10 is of the DC type, the delivered power will also be of the DC type; and the load 11 may comprise circuitry for rectifying at a preselected or feedback-controlled voltage level, for modifying the waveform, for smoothing-out ripples, etc. Alternatively, the power source may be of the AC type; and the load may then take any of a number of forms.

It is well known that an inductance, such as the discussed drive inductance 22, does not consume energy — but merely stores it, and then transfers the stored energy to another location or component, its power loss being minimal. The same concept of inductive power transference may be used to enhance certain circuits, as will be understood from the following discussion.

FIG. 1 indicates that, for the exemplified circuit, it is desirable to use the load transformer 32 for coupling to the load 11. Transformer 32 is preferably optimized for the transferring of power (not for energy storage). Therefore, an auxiliary inductance 40 may be connected into the circuit in such a way that it is charged from power source 10 when the power switch 12 is closed; and, when the power switch 12 is opened, the auxiliary inductance 40 transfers its stored energy to the primary winding of the load transformer 32, which thereupon transfers its energy to its secondary winding, and thus to the load 11. In this way, the load 11 may receive more frequent and larger power pulses.

It will be noted, from FIGS. 2 and 3, that the control and power transistors are closed for a time interval designated as a "time on", and are open for a time interval designated as a "time off". In the preceding discussion, it was assumed that the time-on and the time-off intervals were controlled by a free-running, control oscillator 14 having a frequency in the range of 20K–50 K Hertz. In the case of a 20K Hertz circuit, the total cycle would be about 50 microseconds, with a typical time-on interval being about 15 microseconds, a typical sweep-out interval being about two microseconds, and a typical time-off interval being about ten microseconds — leaving a rest interval of about 25 microseconds, and a duty cycle of 15/50 = 37%. When frequency operations other than 20K Hertz are desired, the various time intervals would be shortened or lengthened, accordingly.

As pointed out above, the disclosed switching circuitry may be timed by a control circuit, such as a free-running oscillator. Alternatively, the control circuit 14 and/or the switch 15 of FIG. 1 may be turned on or off by means of a signal from sensing connections from elements such as a power resistor 42, from the power supply 10, from the load 11, or from selected sensors (not shown) that detect short circuits, overloads, undesirable temperature rises, etc. these producing sensor signals at appropriate times. Thus, the circuit may be made sensitive and responsive to any of a plurality of input and output conditions.

The disclosed circuit of FIG. 1 automatically reacts to load variations as follows. Assume, for example, that a heavy load is applied. This condition may be sensed as indicated above, the load-sensor signal being used to delay the turn-off control signal from control circuit 14. In such a situation, the time-on interval of FIGS. 2 and 3 will be lengthened, and the drive-inductance charge current will be permitted to flow for a longer interval of time, as indicated at 43 of FIG. 4. Under this condition, the drive inductance 22 will charge to a higher value, the base-drive current will reach a higher value, and a higher-value (negative) sweep-out current will be produced, as indicated at 44 of FIG. 4. The disclosed circuit thus produces a more-effective disabling signal.

On the other hand, if a lighter load were applied, a lower-value sweep-out current is produced, so that there is no excessive overdrive of the power transistor 12.

Thus, the disclosed switching circuitry may be made self-regulating with respect to load and to other variations.

THE CASCADED CIRCUIT

Figure 6:
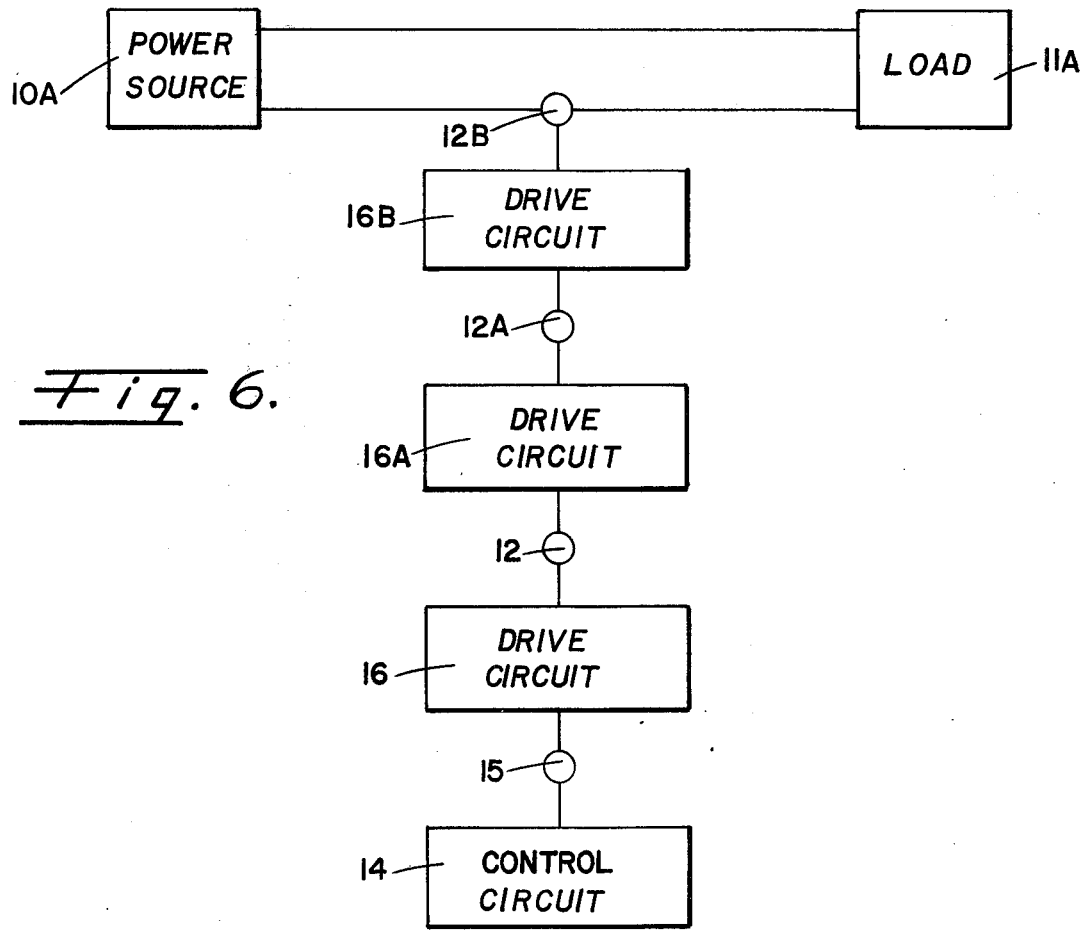
FIG. 6 shows a block diagram of the present invention used in a cascaded manner.

The circuit of FIG. 1 was explained in terms of a low-power-level control system, comprising a control circuit 14 and low-power control transistor 15 for controlling a high-power system, but the disclosed inventive concept may be used for controlling extremely high power systems — and this will be understood from the simplified block diagram of FIG. 6. Here, a plurality of the disclosed drive circuits 16, 16A, 16B, etc., are cascaded in such a way that each controls a progressively higher power system.

FIG. 6 shows a basic control 14 that controls a basic control switch 15, these functioning to control the base drive circuit 16, as previously described. However, the power switch 12 — rather than controlling the load power-source circuit described previously — is used to act as a control switch for a cascaded drive circuit 16A, this, in turn, being used to control another power switch 12A that controls still another cascaded drive circuit 16B. While drive circuit 16B is illustrated as having its power switch 12B controlling a load/power-source circuit 11A/10A, it may be cascaded to further control still another drive circuit.

In this way, the disclosed fast-switching operation may be used to control much higher power circuits.

The disclosed concept also permits a plurality of the disclosed circuits to be combined in parallel, in order to provide more power in a smoother manner. A circuit for this purpose is shown in FIG. 7, wherein the various components are labeled to correspond to previous designations and uses.

Figure 7:
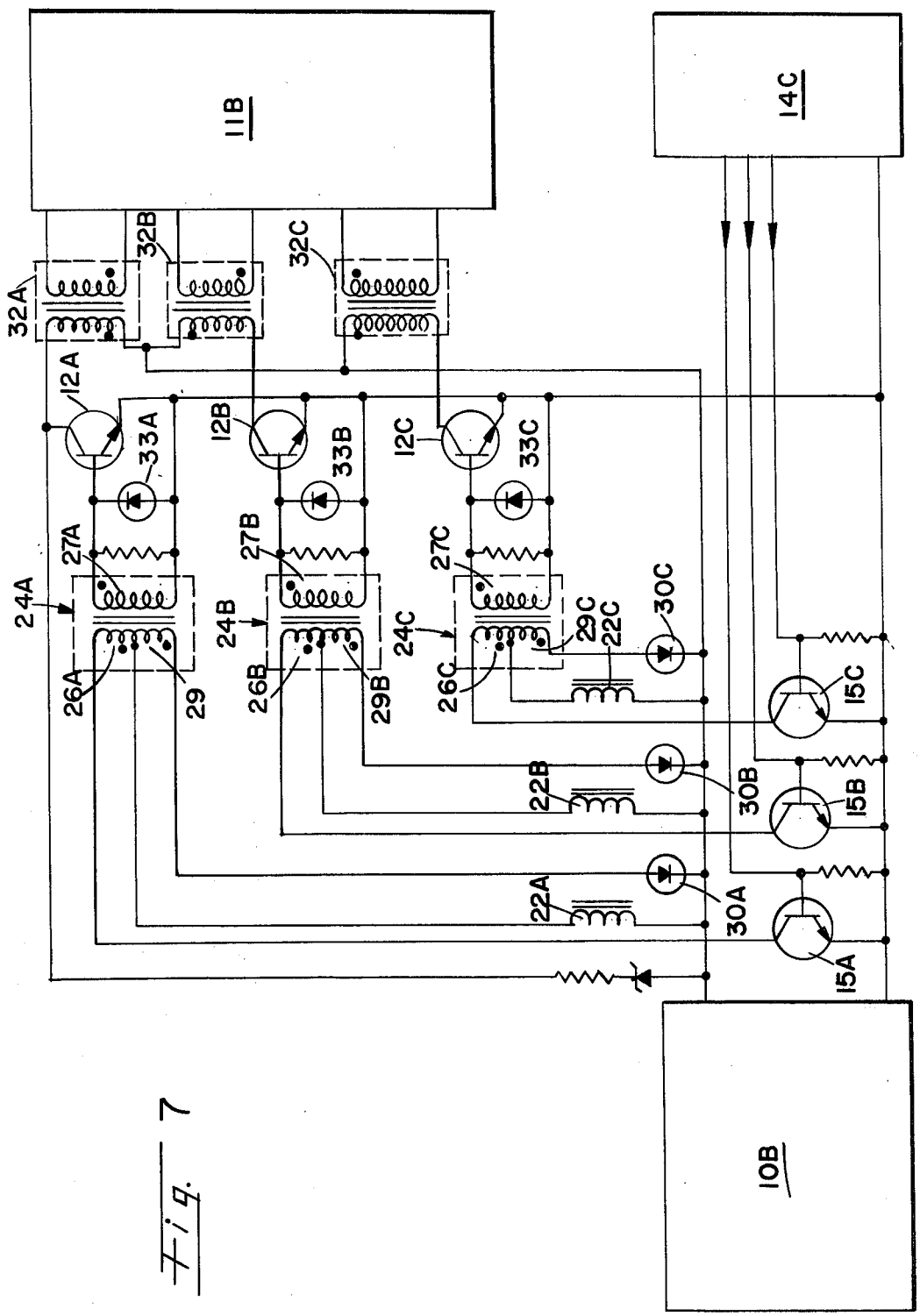
FIG. 7 shows a partially-block/partially-schematic representation of the present invention used in a timed manner.

In the illustration of FIG. 7, a control circuit 14C provides three control signals that are sequentially timed in the manner of a three-phase AC circuit, a ring-counter, or the like; so that three control transistors 15A, 15B, and 15C fire cyclically and sequentially. The individual control transistors 15A, 15B, and 15C open and close respective charge circuits to charge respective drive inductances 22A, 22B, and 22C that act to drive transformers 24A, 24B, and 24C to turn on power switches 12A, 12B, and 12C.

When the individual control transistors 15A, 15B, and 15C break their respective drive circuits, as explained above, corresponding discharge circuits are activated by the charged drive inductances 22A, 22B, and 22C, so that secondary windings 27A, 27B, and 27C are energized to apply sweep-out signals to respective power transistors 12A, 12B, and 12C. In this way, sequential timed current pulses flow to output transformers 32A, 32B, and 32C — whose outputs are shown to be combined and utilized in a manner that is optimal for a given requirement.

SUMMARY

The disclosed invention has a number of important advantages over prior-art circuits. First of all, it is relatively simple. It uses commercially-available components. It consumes very little power, and is thus quite efficient. It uses low-power control elements. It controls power circuits that may be measured in the hundreds or thousands of watts. It controls high-power circuits utilizing very high amperages. It provides switching operations that are extremely fast. Its switches are firmly shut on and shut off. The circuitry may be used in a cascaded manner to provide improved switching control of high-powered systems. A plurality of the disclosed circuits may be sequentially timed to provide improved power handling and improved waveforms. Auxiliary inductances may be used to improve results even further.

I claim:
1. Switching circuitry comprising:
a control switch;
a drive circuit comprising a charge circuit and a discharge circuit;
a drive inductor;
a drive transformer;
said drive transformer having a charge primary winding, a discharge primary winding, and a secondary winding;
said charge circuit comprising said secondary winding and a series circuit of said drive inductor, said control switch, and said charge primary winding;
whereby when said control switch assumes its ON state, a charge current in said charge circuit charges said drive inductor, and produces an enabling signal in said secondary winding;
a power switch adapted to permit the flow of an electric current therethrough;
means for applying said enabling signal to said power switch, for causing said power switch to quickly and positively assume its ON state and for permitting the flow of a load current;
said discharge circuit comprising said secondary winding and a series circuit of said drive inductor and said discharge primary winding;
whereby, when said control switch assumes its OFF state, the energy of said charged drive inductor directly produces a discharge current, and said discharge current in said discharge circuit produces a disabling signal in said secondary winding;
means for applying said disabling signal to said power switch for causing said power switch to quickly and positively assume its OFF state, and for terminating the flow of the load current.

2. The invention of claim 1, wherein said control switch and said power switch are transistors.

3. The invention of claim 1, wherein said discharge circuit further comprises blocking diode means for blocking said charge current from flowing in said discharge circuit.

4. The invention of claim 1, including a second drive circuit;
means for causing said power switch to function as a control switch for said second drive circuit,
whereby said drive circuits are cascaded.

5. The invention of claim 1, including a plurality of control switches, a corresponding plurality of drive circuits associated with respective ones of said control switches, and a corresponding plurality of power switches associated with respective ones of said drive circuits;
means for causing said control-circuit means to conductivate said individual control switches of said plurality of control switches in a sequential timed manner;
whereby said individual drive circuits and said individual power switches are energized in a corresponding sequential timed manner.

6. Switching circuitry comprising:
a control transistor;
control-circuit means for controlling the ON/OFF state of said control transistor;
a drive circuit comprising a charge circuit and a discharge circuit;
a drive inductor;
a drive transformer;
said drive transformer having a charge primary winding, a discharge primary winding, and a secondary winding;
said charge circuit comprising said secondary winding, blocking diode means for blocking said charge current from flowing in said discharge circuit and a series circuit of said drive inductor, said control switch, and said charge primary winding;
whereby, when said control transistor assumes its ON state, a charge current in said charge circuit charges said drive inductor, and produces an enabling signal in said secondary winding;
a power transistor adapted for the flow of an electric current therethrough;
means for applying said enabling signal to said power transistor, for causing said power transistor to quickly and positively assume its ON state;
said discharge circuit comprising said said secondary winding and a series circuit of said drive inductor and said discharge primary winding;
whereby, when said control transistor assumes its OFF state, the energy of said charged drive inductor directly produces a discharge current, and said discharge current in said discharge circuit produces an opposite-polarity disabling signal in said secondary winding;
said disabling signal being a short-interval, high-magnitude, sweep-out current;
means for applying said disabling signal to said power transistor for causing said power transistor to quickly and positively assume its OFF state.

7. The invention of claim 6, including means for controlling the timing of said control circuit means.

* * * * *